United States Patent
Caffee (10) Patent No.: US 9,473,150 B2
(45) Date of Patent: Oct. 18, 2016

(54) PEAK DETECTORS FOR AMPLITUDE CONTROL OF OSCILLATORS

(71) Applicant: Silicon Laboratories Inc., Austin, TX (US)

(72) Inventor: Aaron J. Caffee, Scappoose, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/087,993

(22) Filed: Nov. 22, 2013

(65) Prior Publication Data

US 2015/0145607 A1  May 28, 2015

(51) Int. Cl.
*H03L 5/00* (2006.01)
*H03L 5/02* (2006.01)

(52) U.S. Cl.
CPC .. *H03L 5/00* (2013.01); *H03L 5/02* (2013.01)

(58) Field of Classification Search
CPC .................................. H03L 5/00; H03L 5/02
USPC ...... 331/15, 57, 116 R, 116 FE, 116 M, 109, 331/154, 158, 160, 117 R, 117 FE, 167, 182, 331/183, 185, 186
See application file for complete search history.

(56) References Cited

U.S. PATENT DOCUMENTS

| | | | |
|---|---|---|---|
| 7,126,435 B2 * | 10/2006 | Naviasky et al. | 331/182 |
| 7,327,201 B2 * | 2/2008 | Miyashita et al. | 331/185 |
| 7,479,839 B1 * | 1/2009 | Kossel et al. | 331/177 V |
| 8,816,790 B2 * | 8/2014 | Sinoussi | 331/185 |
| 2002/0075086 A1 * | 6/2002 | Pepper | 331/49 |
| 2003/0001685 A1 * | 1/2003 | Groe | H03L 5/00 331/185 |

OTHER PUBLICATIONS

Kinget, Peter, "Amplitude Detection Inside CMOS LC Oscillators," IEEE ISCAS 2006, pp. 5147-5150.
Murji, Rizwan and Deen, M. Jamal, "A Low-Power, 10 GHZ Back-Gated Tuned Voltage Controlled Oscillator with Automatic Amplitude and Temperature Compensation," IEEE ISCAS 2004, pp. IV-421 to IV-424.

(Continued)

*Primary Examiner* — Richard Tan
(74) *Attorney, Agent, or Firm* — Abel Law Group, LLP (57) ABSTRACT

Various techniques for automatic amplitude control of an oscillator are described. An apparatus includes an oscillator circuit configured to generate an oscillating signal. The apparatus includes a feedback circuit configured to control a bias signal of the oscillator circuit to maintain a target peak amplitude of the oscillating signal based on a current-mode indicator of a peak amplitude of the oscillating signal and a reference current. The feedback loop includes a rectifier circuit configured to generate the current-mode indicator and a summing node configured to provide a bias control signal based on a difference between the current-mode indicator and the reference current. The feedback circuit may include a capacitor coupled to the summing node and configured to accumulate charge according to the difference. A magnitude of the current-mode indicator may be at least two orders of magnitude less than a magnitude of the current through an output node of the oscillator circuit.

19 Claims, 7 Drawing Sheets

(56) References Cited

OTHER PUBLICATIONS

Rogers, John W. M. et al., "A Study of Digital and Analog Automatic-Amplitude Control Circuitry for Voltage-Controlled Oscillators," IEEE Journal of Solid-State Circuits, vol. 38, No. 2, Feb. 2003, pp. 352-356.

Vittoz, Eric A. et al., "High-Performance Crystal Oscillator Circuits: Theory and Application," IEEE Journal of Solid-State Circuits, vol. 23, No. 3, Jun. 1988, pp. 774-783.

\* cited by examiner

FIG. 1

(Prior Art)

FIG. 2

(Prior Art)

PEAK DETECTORS FOR AMPLITUDE CONTROL OF OSCILLATORS

BACKGROUND

1. Field of the Invention

The present invention relates to oscillator circuits and more particularly to automatic amplitude control of oscillator circuits.

2. Description of the Related Art

Figure 1:
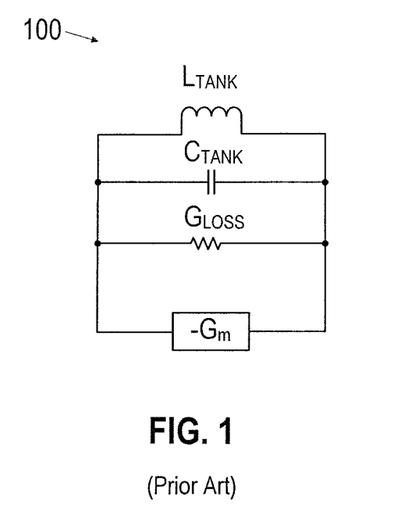
FIG. 1 illustrates a model of a conventional LC oscillator.

In general, electronic oscillator circuits are used to generate repetitive oscillating electronic signals. A conventional tank circuit (i.e., an LC oscillator circuit) is a tuned circuit including an inductor coupled to a capacitor. Charge flows back and forth from the capacitor plates through the inductor so the tuned circuit can store electrical energy oscillating at its resonant frequency. An amplifier circuit compensates for small losses in the tank circuit to sustain oscillation. In general, the quality factor, Q, characterizes a resonator's bandwidth relative to its center frequency. Referring to FIG. 1, the quality factor of a typical parallel tank circuit may be represented as $Q=1/(\omega_0 L_{TANK} G_{loss})$, where $\omega_0$ is the resonant angular frequency of the tank circuit, $L_{TANK}$ is the inductance, and $G_{loss}$ represents the conductive losses due to the inductor, the capacitor, and amplifier loading. A higher Q indicates a lower rate of energy loss relative to the stored energy of the resonator, i.e., oscillations die out more slowly. By supplying a transconductance, $-G_m$, that is equal and opposite to the tank losses ($G_{loss}$), the amplifier is able to sustain oscillation indefinitely at the resonant frequency of the tank and at a unique amplitude determined by the amplifier. Typically, that amplitude is based on the intrinsic limiting behavior of the amplifier. Accordingly, $-G_m$ should be interpreted as an effective transconductance presented to the tank by the amplifier having an absolute value that monotonically decreases with increasing signal amplitudes for a particular bias condition. That is, the amplitude within the oscillator will increase until the effective transconductance of the amplifier is equal and opposite to the tank losses. In that open-loop approach, the amplifier contributes more loading and power to ensure sufficient excess gain under various environmental (temperature, strain, aging, etc.) and manufacturing (e.g., dielectric thickness, conductor thickness, charge carrier mobility, etc.) conditions to regenerate and sustain oscillation.

For oscillator applications that require low power for a particular performance level, typically the amplifier is biased to reduce any excess gain. However, that amplifier bias point may vary as a function of environmental factors (e.g., temperature, strain, aging, etc.), causing the amplitude of the output signal to vary, and therefore, substantially degrade the oscillator performance. Automatic amplitude control techniques may be used to compensate for the effects of those environmental factors. Nevertheless, target performance (e.g., low power consumption for a particular amount of phase noise) may be difficult to achieve using conventional automatic amplitude control techniques. Accordingly, improved automatic amplitude control techniques are desired.

SUMMARY OF EMBODIMENTS OF THE INVENTION

In at least one embodiment of the invention, an apparatus includes an oscillator circuit configured to generate an oscillating signal. The apparatus includes a feedback circuit configured to control a bias signal of the oscillator circuit to maintain a target peak amplitude of the oscillating signal based on a current-mode indicator of a peak amplitude of the oscillating signal and a reference current. The feedback loop includes a rectifier circuit configured to generate the current-mode indicator and a summing node configured to provide a bias control signal based on a difference between the current-mode indicator and the reference current. The feedback circuit may include a capacitor coupled to the summing node and configured to accumulate charge according to the difference. A magnitude of the reference current may be at least two orders of magnitude less than a magnitude of the current through an output node of the oscillator circuit.

In at least one embodiment of the invention, a method includes generating an oscillating signal having a target peak amplitude. The oscillating signal is generated in response to a bias control signal. The method includes generating the bias control signal based on a reference current. Generating the bias control signal includes rectifying the oscillating signal to generate a current-mode indicator of a peak amplitude of the oscillating signal. Generating the bias control signal includes combining the current-mode indicator with the reference current to thereby generate the bias control signal. The reference current may be at least two orders of magnitude less than a current through an output node of the oscillator circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 2:
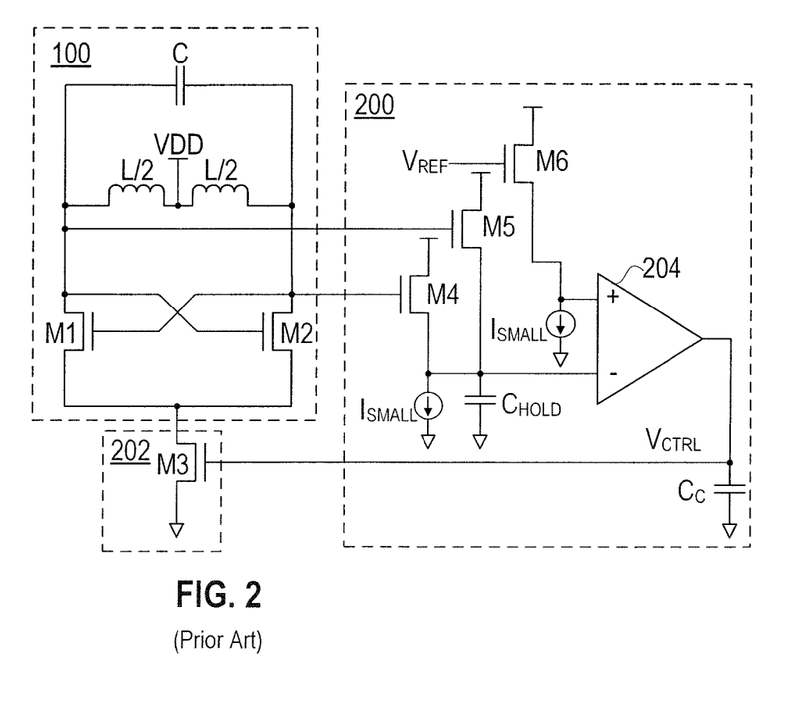
FIG. 2 illustrates a circuit diagram of an LC oscillator coupled to a conventional automatic amplitude control feedback circuit including a voltage-mode peak detector.

Referring to FIG. 2, LC oscillator 100 includes an inductance of L, capacitance C, which represents the capacitance seen at the gates of an amplifier, and the amplifier, which has a negative transconductance. The tank capacitance C may include parasitic capacitance, fixed capacitance, variable capacitance, and/or other capacitances that may be predetermined or dynamically variable. The amplifier includes cross-coupled n-type transistors, M1 and M2, which implement a negative transconductance, $-G_m$, that compensates for the conductive losses of the tank circuit, $G_{loss}$. If $|-G_m|=|G_{loss}|$ then oscillations would be sustained. In a typical LC oscillator, $G_{loss}$ varies and the amplifier is designed to have, at near zero amplitude, $|-G_m|$ that is typically greater than $|G_{loss}|$ by a factor of approximately two or more, resulting in a negative $G_{total}$, to ensure the proper amplitude growth at startup. The amplifier operates in the negative transconductance regime and generates an oscillating signal in the current domain that transitions from sinusoidal behavior to square wave behavior with an increase in the bias current signal provided by device M3. The oscillating signal has a fundamental frequency at the tank resonant frequency of the LC oscillator, but will also include harmonics. Those harmonics are at frequencies higher than resonance and will be seen more by the capacitor than the inductor. Losses of the high frequency harmonics in the capacitor increase $G_{loss}$ and thus, those high frequency harmonics do not assist with sustaining oscillation.

A negative feedback loop of automatic amplitude control circuit 200 senses the voltages on nodes of LC oscillator 100. The negative feedback loop generates a DC signal indicative of the oscillation voltage amplitude using a high-frequency peak voltage rectifier formed from rectifier devices M4 and M5, level shifting device M6, and capacitor $C_{HOLD}$. An error amplifier compares that DC signal to a voltage proportional to a reference voltage level, $V_{REF}$, and generates a control signal for bias generator circuit 202. Bias generator circuit 202 regulates the transconductor tail current of the tank circuit using device M3. The automatic amplitude control circuit provides negative feedback for the oscillation amplitude. As a result, if the peak amplitude of the oscillating signal increases, then automatic amplitude control circuit 200 decreases the tail current, which lowers the gain of the amplifier and decreases the oscillation amplitude to achieve a target amplitude.

To detect the peak-to-peak voltage (i.e. peak voltage) of the oscillating signal, devices M4 and M5 are configured as current-starved voltage followers that provide no DC loading of the oscillator. Although this technique is relatively simple, additional circuitry is required, e.g., a differential error amplifier 204 is needed to complete the control loop. In addition, since the voltage followers introduce a DC offset into the rectified DC signal, that offset is typically matched through a reference voltage path (e.g., the path including device M6 and $I_{SMALL}$) to reduce effects of environmental dependencies of the peak detector as well as to reduce effects of manufacturing variations on circuit operation. As a result, the control loop includes several noise-contributing devices. Furthermore, this technique may use a reference voltage level that forces the oscillator amplitude to a level that may not be optimal or near optimal for the oscillator amplifier. The target reference voltage level may be determined based on voltage headroom requirements of device M3, the gate-to-source voltage, $V_{GS}$ established by devices M1 and M2, and an optimal swing based on the limiting characteristics of the amplifier formed by devices M1 and M2.

Figure 3:
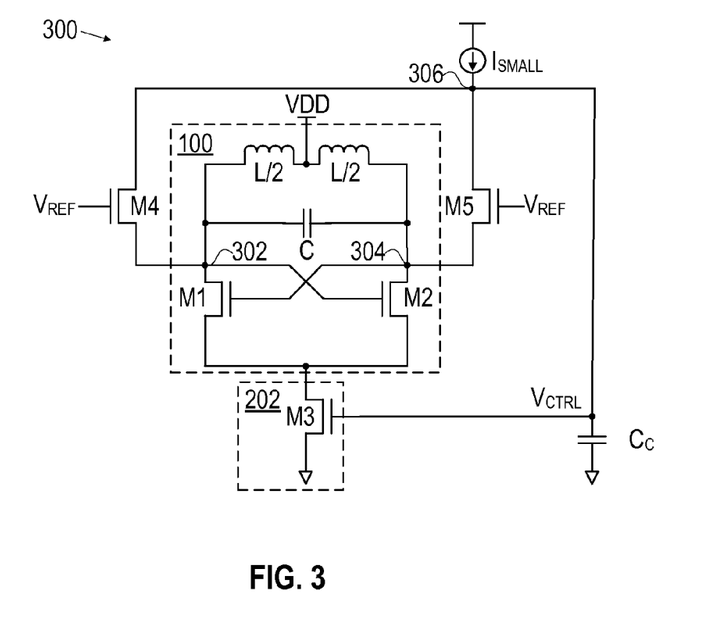
FIG. 3 illustrates a circuit diagram of an LC oscillator coupled to an automatic amplitude control feedback circuit including a current-mode peak detector consistent with at least one embodiment of the invention.

Automatic amplitude control techniques described below simplify the control loop and operate the LC oscillator at a bias amplitude that improves performance (e.g., phase noise and power consumption) as compared to the automatic amplitude control techniques described with reference to FIG. 2. Referring to FIG. 3, rectifier devices M4 and M5 are configured for current-mode peak detection, e.g., rectifier devices M4 and M5 conduct current to $V_{CTRL}$ in response to the voltage at nodes 302 and 304 being near or at a minimum voltage. The current-mode rectified signal generated by rectifier devices M4 and M5 are used to generate a current-mode error signal that is integrated onto a holding capacitor, $C_C$. The automatic amplitude control technique feeds back a control signal, $V_{CTRL}$, to bias generator circuit 202 to provide negative feedback to LC oscillator 100. Accordingly, the automatic amplitude control technique using current-mode peak detection eliminates the need for an error amplifier and simplifies the control loop, as compared to the automatic amplitude control technique of FIG. 2. As a result, the automatic amplitude control technique using current-mode peak detection technique reduces the area, power, and number of noise sources as compared to the automatic amplitude control technique using voltage-mode peak detection.

The voltage sensing technique of FIG. 2 couples a branch of the tank circuit directly to a gate of rectifier device M4 and a gate of rectifier device M5, so that rectifier devices M4 and M5 do not load the tank circuit. In contrast, referring back to FIG. 3, the current mode sensing technique described herein couples a branch of the tank circuit to a source node of rectifier device M4 and a branch of the tank circuit to a source node of rectifier device M5, which contributes to $G_{loss}$, contrary to the goals of LC oscillator design. Note that the current-mode peak detection technique loads LC oscillator 100 and effectively reduces the Q of the tank circuit, which is contrary to typical oscillator design techniques. However, such DC loading may be negligible when peak detector devices are biased with a small reference current that is substantially less than the current of the oscillator amplifier. In addition, note that since the peak detector pulls current from the core oscillator only at the peaks of the oscillator voltage signal, the loading of the tank looks real and causes negligible pulling of the oscillator resonant frequency, and therefore reduced impact on phase noise performance. Rectifier devices M4 and M5 are biased at very low currents to reduce the power consumed from the tank and reduce the impact on the Q of the LC oscillator 100. For example, reference current $I_{SMALL}$ (e.g., the current consumed by rectifier devices M4 and M5 and which is indicative of the target amplitude of oscillation) is at least two orders of magnitude less (e.g., four orders of magnitude) than the amplifier current (e.g., the current consumed by device M3). However, the bandwidth of the automatic amplitude control loop may be increased by increasing $I_{SMALL}$ and/or reducing the capacitance of compensation capacitor $C_C$.

Still referring to FIG. 3, an oscillator current rectifier circuit senses the current of the LC oscillator amplifier and generates a rectified current indicative of the peak amplitude of the current through nodes 302 and 304 of the LC oscillator amplifier. For example, the source of rectifier device M4 is coupled to node 302 of a branch of the tank circuit including device M1 and the source of rectifier device M5 is coupled to node 304 in a branch of the tank circuit including rectifier device M5. The current through rectifier device M4 is indicative of the magnitude of the current through node 302 and the current through rectifier device M5 is indicative of the magnitude of the current through node 304. Node 306 sums those two rectified currents, the sum of which is indicative of the peak current of the tank circuit. Hold capacitor $C_C$ integrates any difference between the indicator of the peak current of LC oscillator 100 and $I_{SMALL}$, thereby generating a control voltage $V_{CTRL}$, based on that error. Bias generator circuit 202 uses control voltage $V_{CTRL}$ to adjust a bias signal to provide negative feedback to LC oscillator 100. In at least one embodiment of the feedback loop, a rectifier circuit includes rectifier device M4 and rectifier device M5, each of which are coupled to summing node 306 via one or more corresponding cascode devices (not shown).

Figure 4:
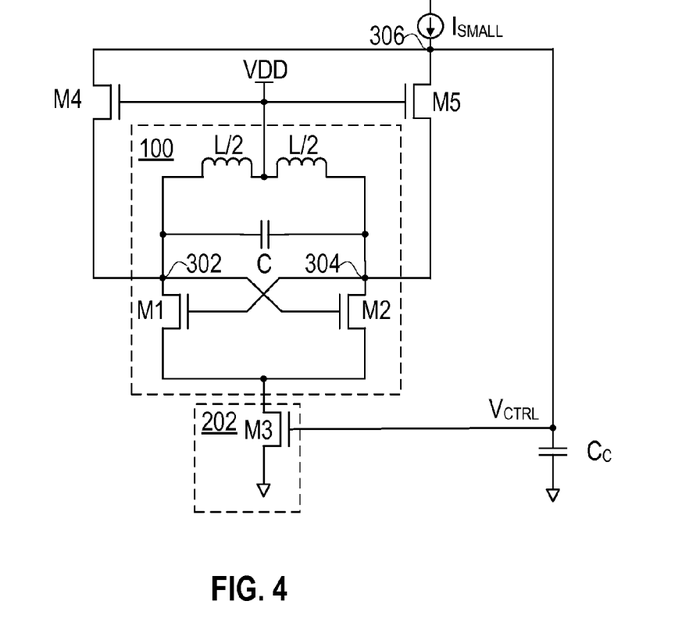
FIG. 4 illustrates a circuit diagram of an LC oscillator coupled to an automatic amplitude control feedback circuit including a current-mode peak detector without a reference voltage generator consistent with at least one embodiment of the invention.

Referring to FIG. 4, in at least one embodiment of the automatic amplitude control technique using current-mode peak detection, the current-mode peak detection has an additional advantage of providing a built-in reference when gates of the peak detector transistors are coupled to a voltage source node of the core oscillator since the threshold voltage of the peak detector devices will behave as a built-in reference voltage for the peak detector. In such embodiments, the control loop is further simplified to not include separate voltage reference generation. For example, the gates of devices M4 and M5 are coupled directly to the center tap of the inductor ($V_{CT}$), which is coupled to $V_{DD}$, and no reference voltage level needs to be generated, although the small bias current $I_{SMALL}$ is still used to operate devices M4 and M5 to provide a suitable signal swing. In at least one embodiment of the feedback loop, a rectifier circuit includes rectifier device M4 and rectifier device M5, each of which are coupled to summing node 306 via one or more corresponding cascode devices (not shown).

By providing the feedback directly to the amplifier using a tail current source, LC oscillator 100 is current-limited. In at least one embodiment of the automatic amplitude control technique using current-mode peak detection, the adjustable bias signal may be applied to a center tap of the inductor and directly varies the current through the inductor. Since the bias voltage is set at the center tap of the inductor, the negative feedback forces $V_{CT}$ to be no greater than necessary. The negative feedback loop compares the rectified current to the reference current and adjusts the bias using $V_{CTRL}$, until the loop reaches equilibrium (e.g., $V_{CT}=V_{TH}+V_{DSAT}$).

Figure 5:
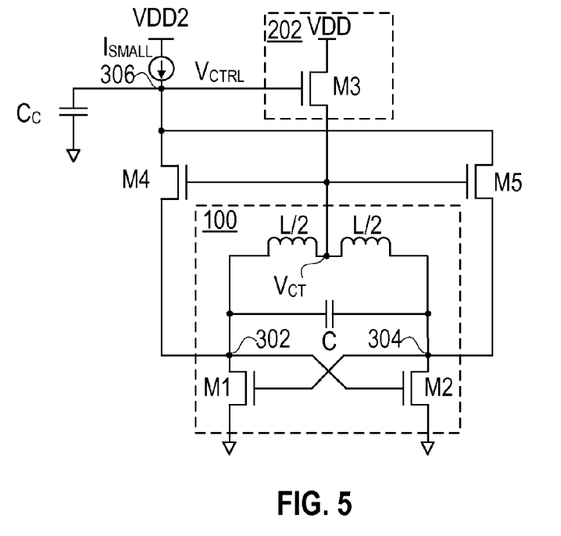
FIG. 5 illustrates a circuit diagram of an LC oscillator coupled to an automatic amplitude control feedback circuit including a current-mode peak detector and integrated regulator consistent with at least one embodiment of the invention.

Referring to FIG. 5, bias generator 202 is coupled to the center tap of the inductor. Device M3 may push $V_{CT}$ to be less than $V_{DD}$ and reaches equilibrium at a bias signal level that is not substantially greater than it needs to be. This technique also integrates voltage regulation into the amplitude control loop, which relaxes the specifications for the reference current generator $I_{SMALL}$. For example, the amplitude of the oscillating signal changes as a function of changes to the threshold voltages of devices M4 and M5 due to environmental factors. As temperature increases, the threshold voltages of M4 and M5 decrease, causing those devices to detect increased peak current. The negative feedback loop decreases $V_{CTRL}$ in response to the increased detected peak, thereby decreasing the bias signal amplitude applied by bias generator circuit 202 to LC oscillator 100. Conversely, as temperature decreases, the threshold voltages of M4 and M5 increase, causing those devices to detect decreased peak current. The negative feedback loop increases $V_{CTRL}$ in response to the decreased detected peak, thereby increasing the bias signal amplitude applied by bias generator circuit 202 to LC oscillator 100. Note that since the embodiment of FIG. 5 includes only n-type devices, to establish enough voltage headroom, reference voltage $V_{DD2}$ may be greater than $V_{DD}$ to generate a $V_{CTRL}$ voltage to suitably turn on device M3. However, in other embodiments (e.g., p-type embodiments), the voltage headroom is adequate and $V_{DD2}$ may be equal to $V_{DD}$. In at least one embodiment of the feedback loop, a rectifier circuit includes rectifier device M4 and rectifier device M5, each of which are coupled to summing node 306 via one or more corresponding cascode devices (not shown).

Figure 6A:
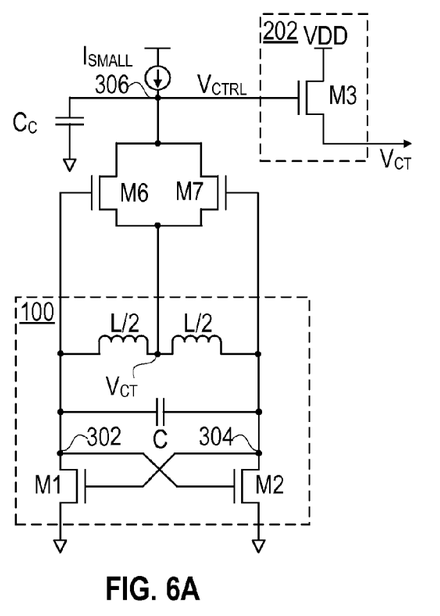
FIG. 6A illustrates a circuit diagram of an LC oscillator coupled to an automatic amplitude control feedback circuit including a current-mode peak detector with voltage-mode sensing consistent with at least one embodiment of the invention.
Figure 6B:
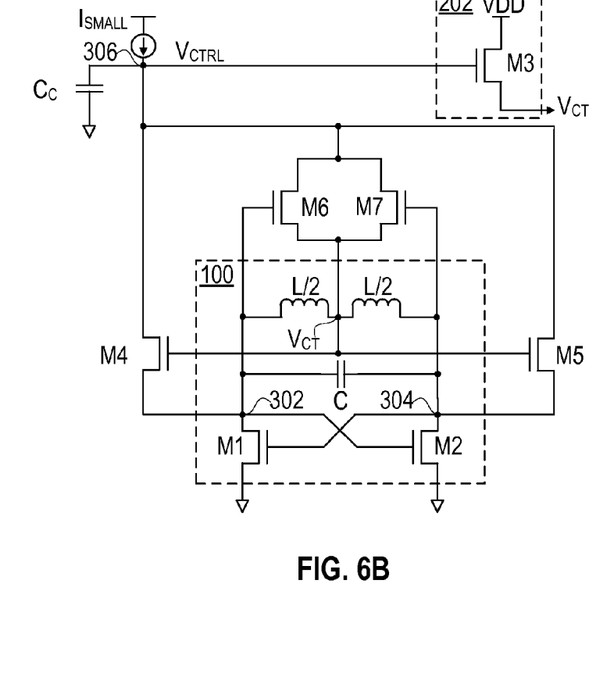
FIG. 6B illustrates a circuit diagram of an LC oscillator coupled to an automatic amplitude control feedback circuit including a current-mode peak detector with mixed-mode sensing consistent with at least one embodiment of the invention.

Referring to FIG. 6A, to sample the maximum of the differential signal at nodes 302 and 304, a voltage sensing technique is used to generate rectified currents indicative of the peak amplitude of the oscillating signal. For example, devices M6 and M7 indirectly sense the peak amplitude current in LC oscillator 100 by sensing the voltage in the LC oscillator and generate a rectified current based thereon in response to the differential signal on nodes 302 and 304 being at or near maximum voltage. Since the gates of devices M6 and M7 are coupled to nodes 302 and 304, respectively, and the sources of those devices are coupled to the bias node of LC oscillator 100, those devices do not present a DC load to LC oscillator 100. In at least one embodiment of the automatic amplitude control technique using current-mode peak detection, current mode sensing of FIG. 5 is combined with the voltage-mode sensing of FIG. 6A to improve signal rectification by sampling the differential oscillating signal on nodes 302 and 304 at the minimum and maximum levels. In at least one embodiment of the feedback loop of FIGS. 6A and 6B, device M6 and device M7 are each coupled to summing node 306 via one or more corresponding cascode devices (not shown).

Figure 7:
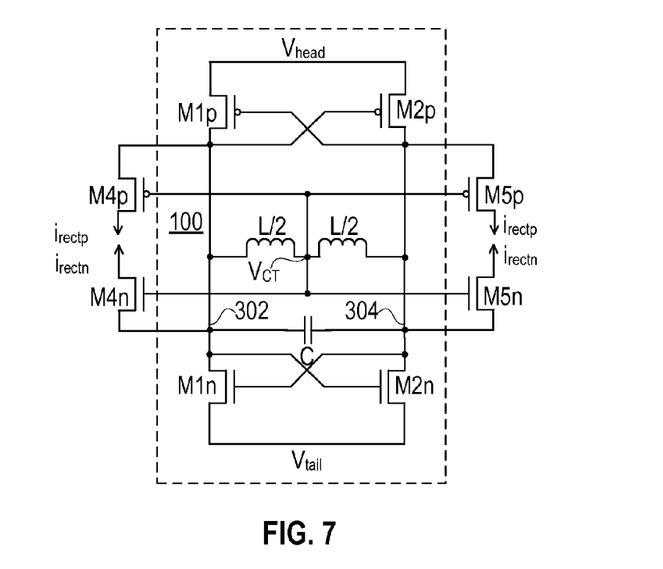
FIG. 7 illustrates a circuit diagram of a complementary metal-oxide-semiconductor (CMOS) logic LC oscillator coupled to a CMOS current-mode peak detector consistent with at least one embodiment of the invention.

Although embodiments of automatic amplitude control technique using current-mode peak detection illustrate the tank circuit as a n-type metal-oxide-semiconductor (NMOS) logic tank circuit using only n-type devices, in at least one embodiment of the automatic amplitude control technique using current-mode peak detection, LC oscillator 100 is a complementary metal-oxide-semiconductor (CMOS) logic tank circuit including n-type and p-type devices. Referring to FIG. 7, a CMOS tank circuit is coupled to a complementary oscillator current rectifier circuit that includes complementary devices M4p and M4n, coupled to a first branch of LC oscillator 100, and complementary devices M5p and M5n, coupled to a second branch of LC oscillator 100. In at least one embodiment of the feedback loop, devices M4n, M4p, M5n, and M5p are each coupled to a feedback circuit (e.g., summing node 306 of the feedback circuit of FIG. 5) via one or more corresponding cascode devices (not shown). The currents from each of those devices are summed and compared to a reference current to generate a negative feedback control signal $V_{CTRL}$ that may be used by a bias regulator to drive $V_{HEAD}$ and/or to drive $V_{TAIL}$ (e.g., using a p-type source follower). The CMOS tank circuit may be used with current-mode sensing, as shown, or with voltage-mode sensing consistent with the embodiments of FIG. 6A, or a combination thereof, consistent with FIG. 6B.

Figure 8:
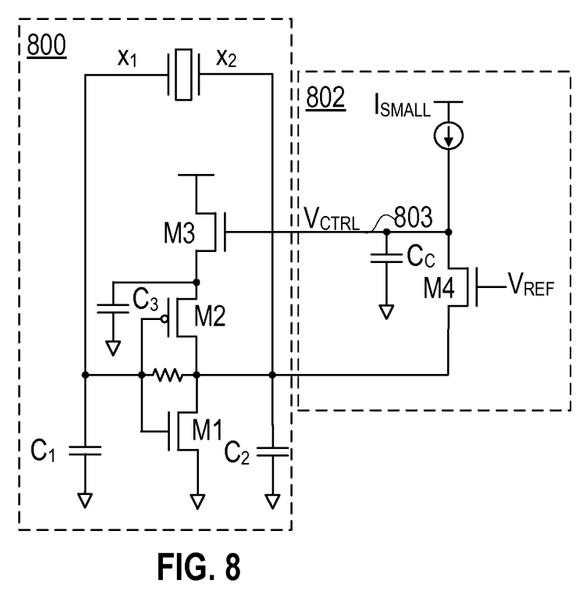
FIG. 8 illustrates a circuit diagram of a crystal oscillator coupled to an automatic amplitude control feedback circuit including a current-mode peak detector consistent with at least one embodiment of the invention.
Figure 9:
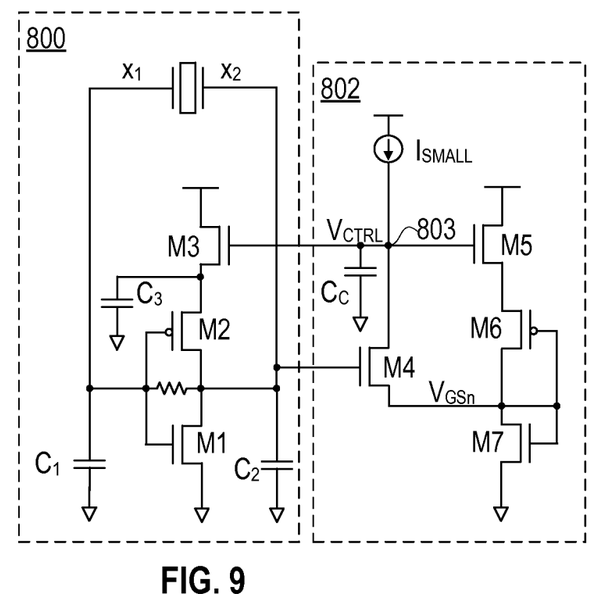
FIG. 9 illustrates a circuit diagram of a crystal oscillator coupled to an automatic amplitude control feedback circuit including a current-mode peak detector with voltage-mode sensing consistent with at least one embodiment of the invention.
Figure 10:
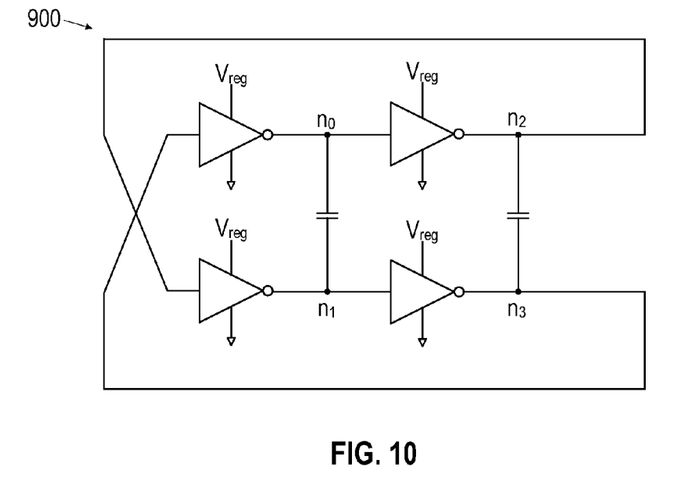
FIG. 10 illustrates a circuit diagram of a ring oscillator consistent with at least one embodiment of the invention.
Figure 11A:
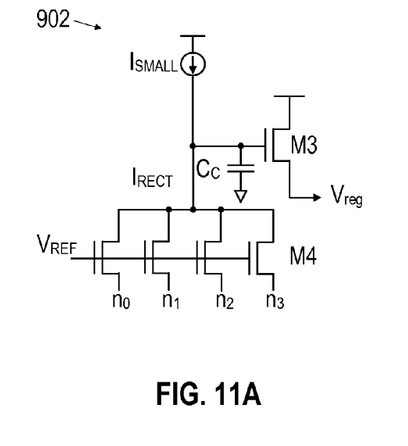
FIG. 11A illustrates a circuit diagram of an automatic amplitude control feedback circuit including a current-mode peak detector for use with the ring oscillator of FIG. 10 consistent with at least one embodiment of the invention.
Figure 11B:
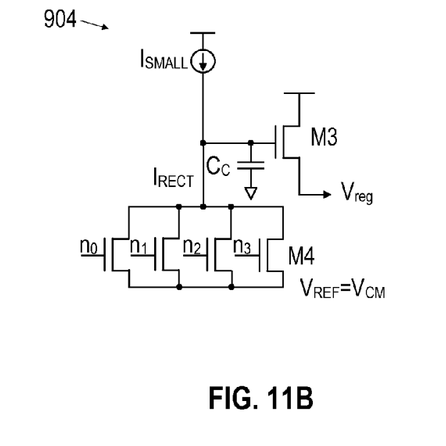
FIG. 11B illustrates a circuit diagram of an automatic amplitude control feedback circuit including a current-mode peak detector with voltage-mode sensing for use with the ring oscillator of FIG. 10 consistent with at least one embodiment of the invention.

In at least one embodiment, the automatic amplitude control techniques described herein are applied to oscillators (e.g., crystal oscillators, RC oscillators, ring oscillators) other than LC oscillators. For example, referring to FIG. 8, feedback circuit 802 includes a rectifier circuit (e.g., device M4), which senses the output signal of crystal oscillator 800. Device M4 is configured as a source follower and behaves as a voltage-gain amplifier that sets the bias current of devices M1 and M2. Although device M4 may be configured to operate in a triode region of transistor operation, improved performance is achieved when device M4 is configured to operate in a saturation region of transistor operation. In other embodiments of an automatic amplitude control feedback circuit, the rectifier circuit includes one or more cascode devices coupled between device M4 and summing node 803 to increase the gain of the rectifier circuit and/or multiple devices M4 are coupled in parallel with different reference voltages on the gate terminals. Rather than sensing the current through the output node of crystal oscillator 800, referring to FIG. 9, feedback circuit 802 senses a voltage on the output node of crystal oscillator 800 without DC loading crystal oscillator 800. Referring to FIGS. 10, 11A, and 11B, automatic amplitude control techniques described herein may be applied to ring oscillator 900 by controlling the inverter bias voltage $V_{reg}$. Feedback circuit 902 implements current-mode sensing of the peak amplitude of the oscillating signal generated by ring oscillator 900. Feedback circuit 904 implements voltage-mode sensing of the peak amplitude of the oscillating signal generated by ring oscillator 900.

Figure 12:
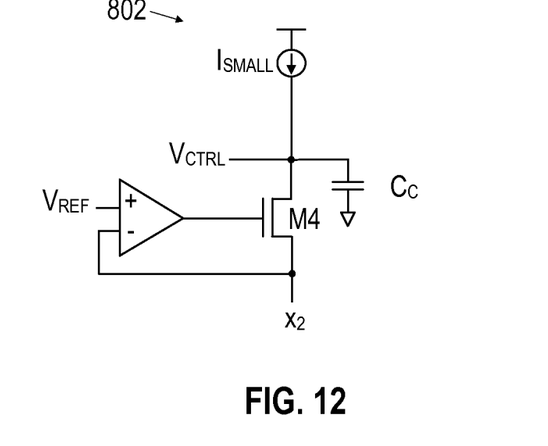
FIG. 12 illustrates a circuit diagram of an automatic amplitude control feedback circuit including a current-mode peak detector for use with the crystal oscillator of FIG. 8 consistent with at least one embodiment of the invention.
Figure 13:
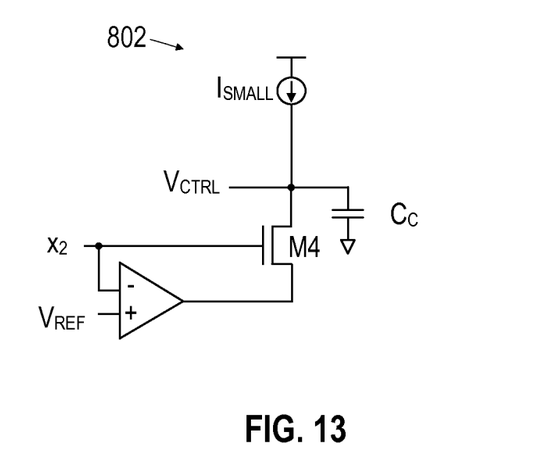
FIG. 13 illustrates a circuit diagram of an automatic amplitude control feedback circuit including a current-mode peak detector with voltage-mode sensing for use with the crystal oscillator of FIG. 9 consistent with at least one embodiment of the invention.

Referring to FIG. 12, in at least one embodiment of the automatic amplitude control techniques described herein, feedback circuit 802 of FIG. 12 (which may be used with crystal oscillator 800 of FIG. 8) senses the current through oscillator output node $x_2$. Feedback circuit 802 includes an operational-amplifier-based peak detector having rectifier device M4 that conducts when the voltage $x_2$ of the crystal oscillator 800 is below reference voltage $V_{REF}$. In at least one embodiment of the automatic amplitude control techniques described herein, feedback circuit 802 of FIG. 13 senses the voltage on the oscillator output $x_2$. Feedback circuit 802 includes an operational-amplifier-based peak detector having rectifier device M4, that conducts when the voltage $x_2$ of the crystal oscillator 800 is above reference voltage $V_{REF}$. In addition, differential embodiments of the feedback circuits of FIGS. 12 and 13 may be used (e.g., with LC oscillator 100 of FIG. 3-6).

Thus various techniques for automatic amplitude control of an oscillator using current-mode peak detection have been described. The description of the invention set forth herein is illustrative, and is not intended to limit the scope of the invention as set forth in the following claims. For example, while the invention has been described in an embodiment in which NMOS circuit embodiments are used, one of skill in the art will appreciate that the teachings herein can be utilized with p-type metal-oxide-semiconductor (PMOS) logic circuit embodiments or CMOS circuit embodiments, although the devices of n-type devices of NMOS circuit embodiments may introduce less noise than p-type devices of PMOS circuit embodiments. In other embodiments, bipolar devices are used. In addition, although the invention has been described in an embodiment in which single-ended techniques are used, one of skill in the art will appreciate that the teachings herein can be utilized with differential signalling techniques. Furthermore, although the invention has been described in embodiments in which the oscillator includes a tank circuit, one of skill in the art will appreciate that the teachings herein can be utilized with other oscillator types (e.g., ring oscillators, crystal oscillators, or other suitable oscillators). Variations and modifications of the embodiments disclosed herein, may be made based on the description set forth herein, without departing from the scope and spirit of the invention as set forth in the following claims.

What is claimed is:

1. An apparatus comprising:
    an oscillator circuit configured to generate an oscillating signal; and
    a feedback circuit configured to control a bias signal of the oscillator circuit to maintain a target peak amplitude of the oscillating signal based on a current-mode indicator of a peak amplitude of the oscillating signal and a reference current, the feedback circuit comprising:
        a rectifier circuit configured to directly sense current of the oscillator circuit and generate the current-mode indicator based on the sensed current; and
        a summing node configured to provide a bias control signal based on a difference between the current-mode indicator and the reference current,
        wherein the rectifier circuit includes a transistor having a source terminal directly coupled to the oscillator circuit, a gate terminal directly coupled to a bias node of the oscillator circuit, and a drain terminal coupled to the summing node.

2. The apparatus, as recited in claim 1, wherein the feedback circuit further comprises:
    a capacitor directly coupled to the summing node and configured to accumulate charge according to the difference.

3. An apparatus comprising:
    an oscillator circuit configured to generate an oscillating signal; and
    a feedback circuit configured to control a bias signal of the oscillator circuit to maintain a target peak amplitude of the oscillating signal based on a current-mode indicator of a peak amplitude of the oscillating signal and a reference current, the feedback circuit comprising:
        a rectifier circuit configured to generate the current-mode indicator; and
        a summing node configured to provide a bias control signal based on a difference between the current-mode indicator and the reference current,
        wherein the rectifier circuit includes a device having a gate terminal directly coupled to the oscillator circuit, a source terminal directly coupled to a bias node of the oscillator circuit, and a drain terminal coupled to the summing node.

4. The apparatus, as recited in claim 1, wherein the gate terminal is directly coupled to a center tap of an inductor of the oscillator circuit.

5. The apparatus, as recited in claim 3, wherein the source terminal is directly coupled to a center tap of an inductor of the oscillator circuit.

6. The apparatus, as recited in claim 1, further comprising:
a bias signal regulator directly coupled to the oscillator circuit and responsive to the bias control signal to maintain the target peak amplitude.

7. The apparatus, as recited in claim 6, wherein the bias signal regulator is directly coupled to a center tap of an inductor of the oscillator circuit.

8. The apparatus, as recited in claim 1, wherein a magnitude of the reference current is at least two orders of magnitude less than a magnitude of the current of the oscillator circuit.

9. The apparatus, as recited in claim 1, wherein the rectifier circuit loads the oscillator circuit thereby reducing a quality factor of the oscillator circuit.

10. The apparatus, as recited in claim 3, wherein the rectifier circuit uses voltage-mode sensing to sense a current of the oscillator circuit.

11. The apparatus, as recited in claim 1, wherein the transistor is configured to operate only in saturation and cutoff regions of operation.

12. A method comprising:
generating an oscillating signal having a target peak amplitude, the oscillating signal being generated using an oscillator circuit in response to a bias control signal; and
generating the bias control signal based on a reference current, wherein generating the bias control signal comprises:
rectifying the oscillating signal to generate a current-mode indicator of a peak amplitude of the oscillating signal by directly sensing current of the oscillating signal, the rectifying loading the oscillator circuit thereby reducing a quality factor of the oscillator circuit; and
integrating a difference between the current-mode indicator and the reference current using a capacitor to generate the bias control signal,
wherein the generating the oscillating signal comprises providing the bias control signal directly from the capacitor to a gate terminal of a bias generator transistor, the bias generator transistor being directly coupled to the oscillator circuit.

13. The method, as recited in claim 12, wherein the reference current is at least two orders of magnitude less than the current of the oscillating signal.

14. The method, as recited in claim 12, wherein the reference current is approximately four orders of magnitude less than the current of the oscillating signal.

15. The method, as recited in claim 12, wherein the rectifying includes current-mode sensing of the current of the oscillating signal using a device configured as a voltage-mode amplifier.

16. The method, as recited in claim 12, wherein the bias generator transistor provides a head current to the oscillator circuit.

17. The method, as recited in claim 12, wherein the bias generator transistor provides a tail current to the oscillator circuit.

18. The method, as recited in claim 12, wherein the integrating accumulates charge on the capacitor according to the difference.

19. The method, as recited in claim 12, wherein the bias generator transistor drives a voltage on a center tap of an inductor of the oscillator circuit to be less than a power supply voltage.

* * * * *